United States Patent [19]

Kageyama

[11] Patent Number: 5,365,195

[45] Date of Patent: Nov. 15, 1994

[54] VOLUME CONTROL APPARATUS PRODUCING REDUCED NOISE AND DISTORTION

[75] Inventor: Tohru Kageyama, Saitama, Japan

[73] Assignee: Pioneer Electronic Corporation, Tokyo, Japan

[21] Appl. No.: 60,054

[22] Filed: May 13, 1993

[30] Foreign Application Priority Data

May 14, 1992 [JP] Japan .................. 4-121723

[51] Int. Cl.$^5$ ............................ H03G 3/30
[52] U.S. Cl. .................. 330/284; 330/149; 307/542; 327/310; 327/551
[58] Field of Search ............ 330/144, 145, 149, 284; 307/542, 549; 328/171; 333/81 R

[56] References Cited

U.S. PATENT DOCUMENTS 4,888,496 12/1989 Schmitz ..................... 307/542 X

Primary Examiner—James B. Mullins
Attorney, Agent, or Firm—Sughrue, Mion, Zinn, Macpeak & Seas

[57] ABSTRACT

This invention provides a volume apparatus, which is formed of semiconductor resistors and semiconductor switches and which reduces distortion and noise in attenuation signals. The volume apparatus, which comprises: a first semiconductor voltage dividing circuit successively attenuating an input signal and outputting attenuated signals; a first semiconductor switch circuit controlling the supply of the attenuated signals output from the first semiconductor voltage dividing circuit; a phase inversion circuit for inverting the phase of the input signal; a second semiconductor voltage dividing circuit successively attenuating the input signal output from the phase inversion circuit and outputting attenuated signals; a second semiconductor switch circuit controlling the supply of the attenuated signals output from the second semiconductor voltage dividing circuit; a volume control circuit controlling the first and second semiconductor switch circuits according to a control signal; and a differential amplifier having one of input terminals thereof connected to the output of the first semiconductor switch circuit and the other connected to the output of the second semiconductor switch circuit.

3 Claims, 4 Drawing Sheets

VOLUME CONTROL APPARATUS PRODUCING REDUCED NOISE AND DISTORTION

BACKGROUND OF THE INVENTION

1. Field of the Invention

The present invention relates to a volume apparatus formed of semiconductor resistors and semiconductor switches.

2. Description of the Prior Art

FIG. 3 is a circuitry of a conventional volume apparatus. In the figure, designated 1 is an input terminal, and 2 a semiconductor voltage dividing circuit which consists of semiconductor resistors $2_1, 2_2, \ldots, 2_n$ connected in series, with the semiconductor resistor $2_1$ connected to the input terminal 1 and the semiconductor resistor $2_n$ grounded.

Denoted 3 is a semiconductor switch circuit which consists of semiconductor switches $3_1, 3_2, \ldots, 3_{(n+1)}$. One end of the semiconductor switch $3_1$ is connected to a connection point between the input terminal 1 and the semiconductor resistor $2_1$; one end of the semiconductor switch $3_2$ is connected to a connection point between the semiconductor resistor $2_1$ and the semiconductor resistor $2_2$; ... and one end of the semiconductor switch $3_{(n+1)}$ is connected to a connection point between the semiconductor resistor $2_n$ and the ground.

Denoted 4 is a zero-cross detection circuit connected to the input terminal 1 which detects when the input signal supplied to the input terminal 1 becomes zero and outputs a timing signal.

Reference numeral 5 represents a control signal input terminal to which a control signal is supplied; and number 6 represents a volume control circuit which issues a switching control signal for controlling the semiconductor switches $3_1, 3_2, \ldots, 3_{(n+1)}$ of the semiconductor switch circuit 3 according to the timing signal from the zero-cross detection circuit 4 and the control signal from the control signal input terminal 5.

Denoted 7 is a buffer circuit whose input is connected to the second ends of the semiconductor switches $3_1, 3_2, \ldots, 3_{(n+1)}$ of the semiconductor switch circuit 3. Reference number 8 indicates an output terminal to which the output of the buffer circuit 7 is supplied.

Now, the operation of this circuit will be described in the following.

First, the input signal supplied to the input terminal 1 is divided by the semiconductor voltage dividing circuit 2, from which attenuation signals having different attenuations, obtained from a single input signal, are output to the semiconductor switch circuit 3.

The input signal is also sent to the zero-cross detection circuit 4, which detects when the input signal becomes zero and issues a timing signal.

Based on the timing signal from the zero-cross detection circuit 4 and the control signal supplied to the control signal input terminal 5, the volume control circuit 6 outputs a switching control signal for controlling the semiconductor switches $3_1, 3_2, \ldots, 3_{(n+1)}$ of the semiconductor switch circuit 3 to produce a desired attenuation signal. Since only one of the semiconductor switches $3_i$ (where $i=1, 2, \ldots, (n+1)$) that make up the semiconductor switch circuit 3 conducts, the desired attenuation signal is fed to the buffer circuit 7 where it is impedance-converted before being supplied to the output terminal 8.

With the volume control circuit 6 controlling the semiconductor switch circuit 3 according to the timing signal and the control signal, an attenuation signal, which was obtained by attenuating the input signal supplied to the input terminal 1 to a desired signal level, can be produced at the output terminal 8.

The zero-cross detection circuit 4, since it must detect precisely the instant at which the input signal supplied from the input terminal 1 becomes zero, is required to operate at high speeds.

In the conventional volume apparatus, since the voltage dividing circuit and the switch circuit are formed of semiconductors, distortions consisting mainly of second harmonic components are superimposed upon the attenuation signals. Further, the buffer circuit 7 has a high-impedance input and operates at high speeds, so that the attenuation signals are likely to be superimposed with noise which is generated by unwanted external radiation and by the zero-cross detection circuit 4 that produces noise containing high-frequency components.

Next, let us describe distortions superimposed on the attenuation signals.

FIG. 4 schematically shows a part of the semiconductor voltage dividing circuit. In the figure, designated $R_1$, $R_2$ are semiconductor resistors, $V_1$ an absolute voltage applied to the semiconductor resistor $R_1$, $V_2$ an absolute voltage applied to the semiconductor resistor $R_2$, $V_{BR1}$ a reverse bias voltage applied to the semiconductor resistor $R_1$, $V_{BR2}$ a reverse bias voltage applied to the semiconductor resistor $R_2$, $V_i$ an input signal voltage, $V_o$ an output signal voltage, and $V_r$ a reference potential for the input signal voltage $V_i$ and the output signal voltage $V_o$. The following relationship holds:

$$V_1 = (V_i + V_r), \quad V_2 = (V_o + V_r)$$

First, the reverse bias voltages $V_{BR1}$, $B_{BR2}$ of the semiconductor resistors $R_1$, $R_2$ are assumed to be averages of the resistors' terminal voltages. Then they are given by $$\begin{aligned} V_{BR1} &= [(V_i + V_r) + (V_o + V_r)]/2 \\ &= V_r + (V_i + V_o)/2 \end{aligned} \quad (1)$$

$$\begin{aligned} V_{BR2} &= [V_r + (V_o + V_r)]/2 \\ &= V_r + V_o/2 \end{aligned} \quad (2)$$

Next, if we let the resistance value of the semiconductor resistors $R_1$, $R_2$ when applied only with the reference voltage be R and the rate of change of the reverse bias for unit voltage increment be K (normally $1 \gg K$), then the reverse bias voltage dependency characteristic of the semiconductor resistor $R_1$, $R_2$ can be expressed as $$R_1, R_2 = (1 + K \times V_{BR1}, V_{BR2}) \times R \quad (3)$$

The resistance value of the semiconductor resistors $R_1$, $R_2$ increases monotonously when applied with $V_{BR1}$ and $V_{BR2}$.

From equation (1) and equation (2), $$R_1 = [1 + K \times [V_r + (V_i + V_o)/2]] \times R \quad (4)$$

$$R_2 = [1 + K \times (V_r + V_o/2)] \times R \quad (5)$$

Since $$V_o = [R_2/(R_1 + R_2)] \times V_i \quad (6)$$

substituting equation (4) and equation (5) into equation (6) result in $$V_o = [(K \times V_o/2 + K \times V_r + 1)/(K \times V_o + K \times V_i/2 + 2K \times V_r + 2)] \times V_i \quad (7)$$

Multiplying the both members with $(K \times V_o + K \times V_i/2 + 2K \times V_r + 2)$ and rewriting the equation gives $$V_o^2 + 2(1/K + V_r) \times V_o = (1/K + V_r) \times V_i \quad (8)$$

Here if we assume that $(1/K + V_r) = 1/C \approx 1/K$ ($\because 0 < K << 1$), the left member of the equation (8) can be rewritten as $$(V_o + 1/C)^2 = V_i/C + (1/C)^2 \quad (9)$$

Rewriting the equation (9) gives $$\begin{aligned} V_o + 1/C &= [V_i/C + (1/C)^2]^{\frac{1}{2}} \\ &= (1 + C \times V_i)^{\frac{1}{2}}/C \end{aligned} \quad (10)$$

Therefore, rewriting the equation (8), we obtain $$V_o = [(1 + C \times V_i)^{\frac{1}{2}} - 1]/C \quad (11)$$

Performing the Tailer expansion on $(1 + C \times V_i)^{\frac{1}{2}}$ and rewriting the equation, we obtain $$V_o = (V_i - K \times V_i^2/2 + K^2 \times V_i^3/8 - \ldots)/2 \quad (12)$$

In the above equation (12), since $0 < K << 1$, the third term $(K^2 \times V_i^3/8)$ and the succeeding terms become so small as to be negligible. Hence, the distortion should only need to consider the second harmonic components.

SUMMARY OF THE INVENTION

The present invention has been accomplished to overcome the above-mentioned drawback and its objective is to provide a volume apparatus which can reduce distortions and noise in attenuation signals.

To achieve the above objective, the volume apparatus according to the present invention comprises: a first semiconductor voltage dividing circuit made up of a plurality of semiconductor resistors connected in series, the series resistors successively attenuating an input signal and outputting attenuated signals; a first semiconductor switch circuit made up of a plurality of semiconductor switches, the semiconductor switches controlling the supply of the attenuated signals output from the first semiconductor voltage dividing circuit; a phase inversion circuit for inverting the phase of the input signal; a second semiconductor voltage dividing circuit made up of a plurality of semiconductor resistors connected in series, the series resistors successively attenuating the input signal output from the phase inversion circuit and outputting attenuated signals; a second semiconductor switch circuit made up of a plurality of semiconductor switches, the semiconductor switches controlling the supply of the attenuated signals output from the second semiconductor voltage dividing circuit; a volume control circuit controlling the first and second semiconductor switch circuits according to a control signal; and a differential amplifier having one of input terminals thereof connected to the output of the first semiconductor switch circuit and the other connected to the output of the second semiconductor switch circuit.

In the volume apparatus according to a second aspect of the present invention, the first and second semiconductor voltage dividing circuits are formed in the same configuration and at the same time the first and second semiconductor switch circuits are formed in the same configuration.

Since the volume apparatus of this invention has the above-mentioned configuration, the attenuation signals output from the first and second semiconductor switch circuits are both added up by the differential amplifier before being output, thereby canceling noise (second harmonic components) contained in both attenuation signals.

DETAILED DESCRIPTION OF PREFERRED EMBODIMENT

One embodiment of this invention will be described in detail by referring to the accompanying drawings.

Figure 1:
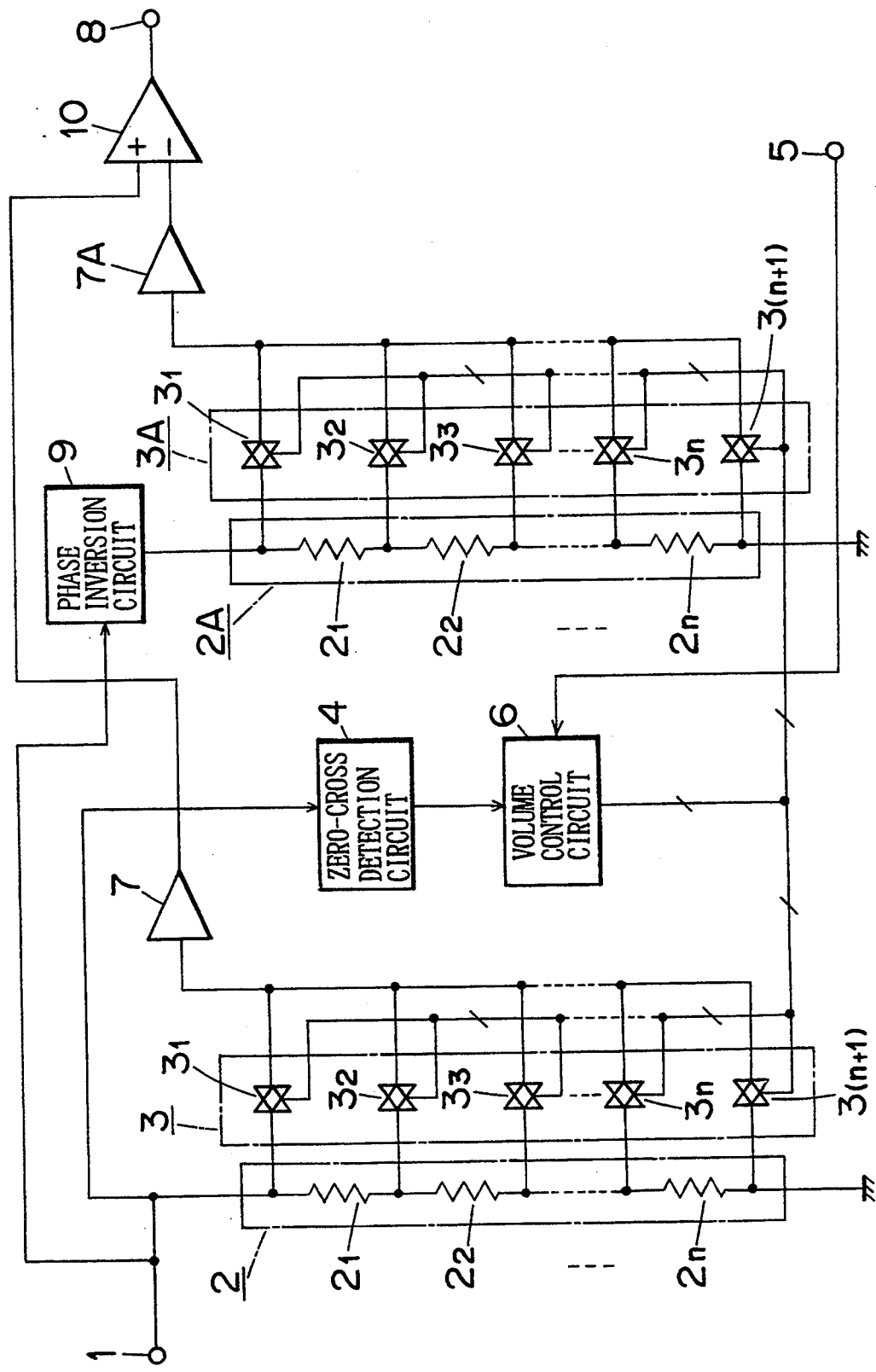
FIG. 1 is a circuit diagram showing the configuration of the volume apparatus as one embodiment of this invention.

FIG. 1 is a circuit diagram showing the configuration of the volume apparatus as one embodiment of this invention. In the figure, components identical with those of FIG. 3 are given like reference numerals.

In FIG. 1, denoted 9 is a phase inversion circuit which inverts the phase of the input signal supplied to the input terminal 1. A second semiconductor voltage dividing circuit 2A has the same configuration as the semiconductor voltage dividing circuit 2 of FIG. 3 (first semiconductor voltage dividing circuit) and has the same characteristics.

Figure 3:
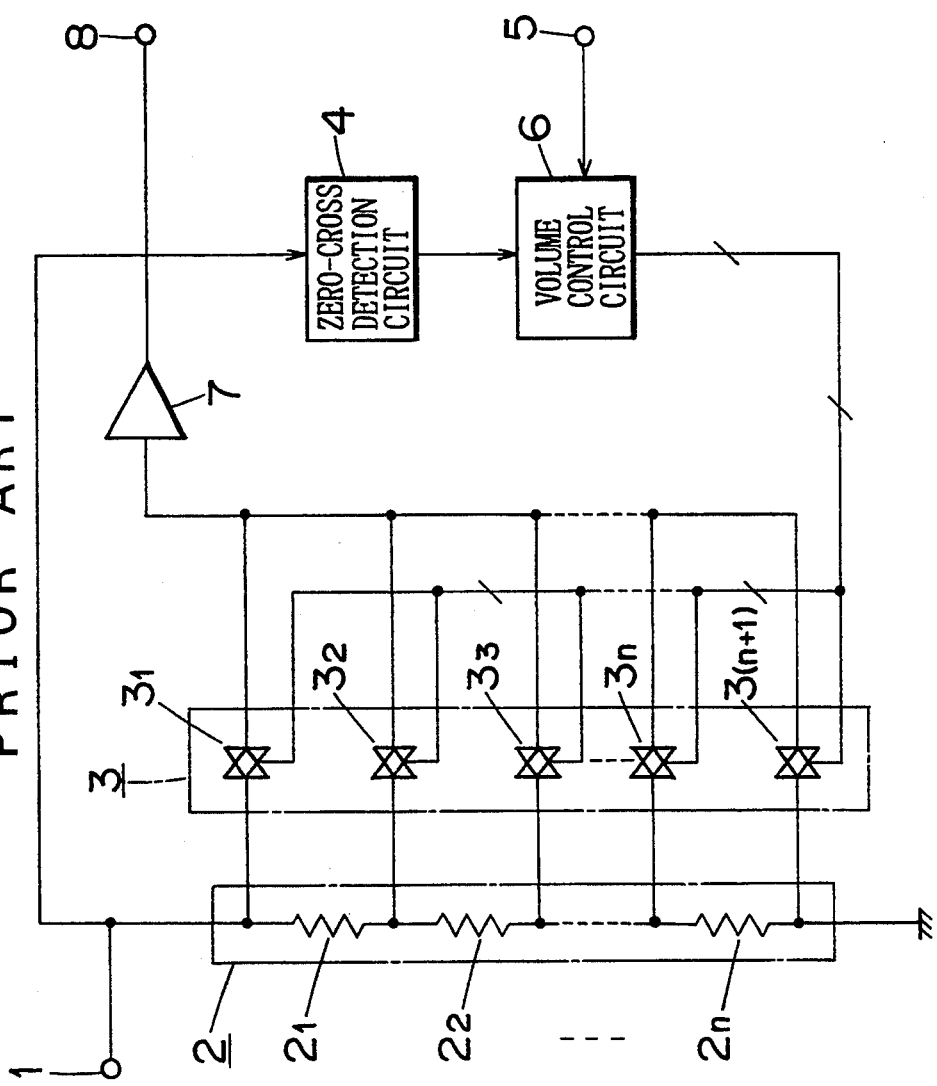
FIG. 3 is a circuit diagram showing the configuration of the conventional volume apparatus.
Figure 4:
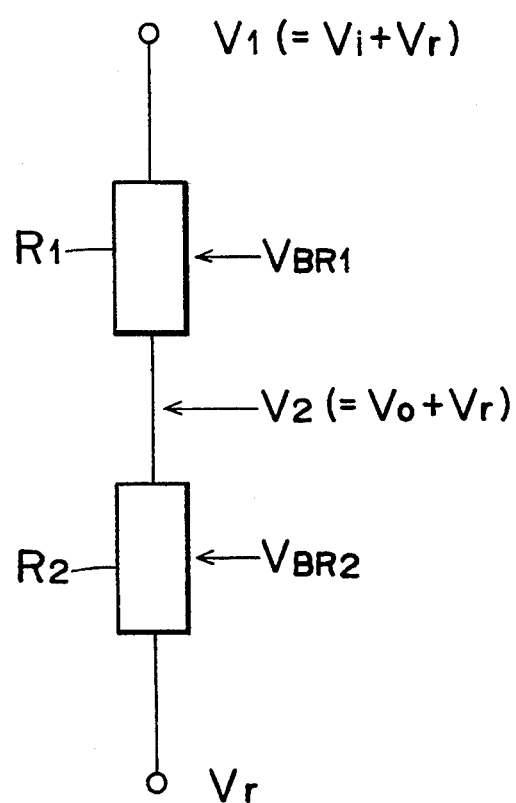
FIG. 4 is a schematic diagram showing a part of the semiconductor voltage dividing circuit.

A second switch circuit 3A has the same configuration and characteristics as the semiconductor switch circuit 3 of FIG. 3 (first semiconductor switch circuit) 3.

A second buffer circuit 7A has its input connected to the second ends of the semiconductor switches $3_1, 3_2, \ldots, 3_{(n+1)}$ that make up the second switch circuit 3A.

A differential amplifier 10 has its non-inverted input connected to the output of the buffer circuit (first buffer circuit) 7 and the inverted input connected to the output of the second buffer circuit 7A. The output of the differential amplifier 10 is connected to the output terminal 8.

Next, the operation of the volume apparatus will be explained.

The input signal supplied to the input terminal 1 is divided by the first semiconductor voltage dividing circuit 2, from which attenuation signals of different attenuations obtained from the input signal are output to the first semiconductor switch circuit 3. The input signal is also inverted in phase by the phase inversion circuit 9 and then is divided by the second semiconductor voltage dividing circuit 2A. The second semiconductor voltage dividing circuit 2A supplies to the second semiconductor switch circuit 3A attenuation signals of different attenuations that were obtained from the input signal.

The input signal is also fed to the zero-cross detection circuit 4, which detects when the input signal becomes zero and outputs a timing signal to the volume control circuit 6. According to the timing signal from the zero-cross detection circuit 4 and the control signal supplied to the control signal input terminal 5, the volume control circuit 6 produces a switching control signal that controls the semiconductor switches $3_1, 3_2, \ldots, 3_{(n+1)}$, which make up the first and second semiconductor switch circuits 3, 3A, in order to produce desired attenuation signals.

Applied with the switching control signal, the first and second semiconductor switch circuits 3, 3A each have only one semiconductor switch $3_i$ turned on (the two switches represent the same attenuation), thus feeding the desired attenuation signals to the first and second buffer circuits 7, 7A respectively where they are subjected to the impedance conversion, before being supplied to the differential amplifier 10.

Since the two attenuation signals supplied from the first and second buffer circuits 7, 7A are opposite in phase, they are added up by the differential amplifier 10 to produce a signal with a level double the input of the amplifier and then the sum signal is sent to the output terminal 8. At this time, since the second harmonic components contained in these two attenuation signals are of the same phase, they are canceled out in the differential amplifier 10.

With the above-mentioned embodiment of this invention, since the distortion and noise superimposed on an attenuation signal are also superimposed on a second attenuation signal whose phase is inverted from the input signal and these two attenuation signals are supplied to the differential amplifier to cancel the distortion and noise, it is possible not only to minimize distortion and noise but to double the level of the attenuation signal.

Figure 2:
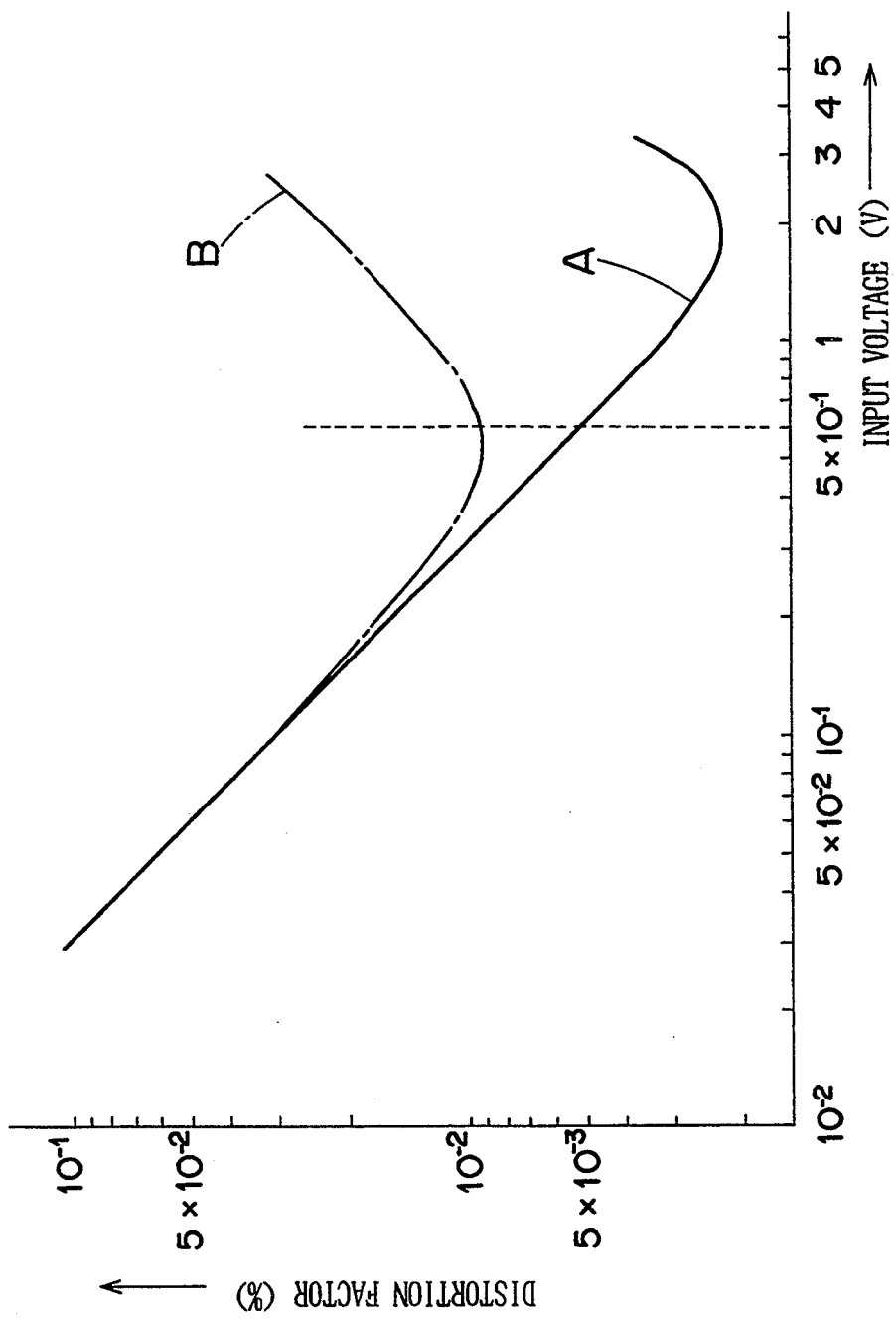
FIG. 2 is a characteristic diagram showing the distortion factors in the embodiment of the invention and the conventional volume apparatus.

Comparison between the distortion factor of the embodiment of this invention and that of the conventional apparatus is shown in FIG. 2. In FIG. 2, a curve A represents the characteristic of this embodiment, while a curve B represents the characteristic of the conventional apparatus. The abscissa represents an input voltage and the ordinate represents a distortion factor. An area less than the input voltage of $6 \times 10^{-1}$V (area to the left of the dashed line) is a region where residual noise is dominant. In an area higher than the input voltage of $6 \times 10^{-1}$V (area to the right of the dashed line), distortion is dominant.

As can be seen from the characteristic curves A, B, when the input voltage is 2 V, the distortion factor is approximately 0.002% in the embodiment of the invention as opposed to about 0.01% in the conventional case, an improvement of almost one order of magnitude.

While the above embodiment has been described to employ the zero-cross detection circuit 4 in obtaining a timing signal for controlling the switching of volume, it is possible to omit the zero-cross detection circuit 4 and still obtain the similar effect.

The advantages of this invention may be summarized as follows.

Since the distortion and noise superimposed on an attenuation signal are also superimposed on a second attenuation signal whose phase is inverted from the input signal and these two attenuation signals are supplied to the differential amplifier to cancel the distortion and noise, it is possible to minimize distortion and noise. Furthermore, since not only are the first and second semiconductor voltage dividing circuits made equal in configuration but the first and second semiconductor switch circuits are also formed in the same configuration, the distortion and noise can be further reduced.

What is claimed is:

1. A volume apparatus comprising:
   a first semiconductor voltage dividing circuit made up of nonlinear a plurality of semiconductor resistors connected in series, the series resistors successively attenuating an input signal and outputting attenuated signals;
   a first semiconductor switch circuit made up of a plurality of semiconductor switches, the semiconductor switches controlling the supply of the attenuated signals output from the first semiconductor voltage dividing circuit;
   a phase inversion circuit for inverting the phase of the input signal;
   a second semiconductor voltage dividing circuit made up of nonlinear a plurality of semiconductor resistors connected in series, the series resistors successively attenuating the input signal output from the phase inversion circuit and outputting attenuated signals;
   a second semiconductor switch circuit made up of a plurality of semiconductor switches, the semiconductor switches controlling the supply of the attenuated signals output from the second semiconductor voltage dividing circuit;
   a volume control circuit controlling the first and second semiconductor switch circuits according to a control signal; and
   a differential amplifier having one of input terminals thereof connected to the output of the first semiconductor switch circuit and the other connected to the output of the second semiconductor switch circuit;
   whereby the attenuated signals from the first semiconductor switch circuit are supplied to one input terminal of the differential amplifier and the attenuated signals from the second semiconductor switch circuit, whose phase is inverted from that of the signals from the first semiconductor switch circuit, are supplied to the other input terminal of the differential amplifier to cancel noise and distortions of nonlinear these two kinds of attenuated signals and amplify the attenuated signals by two times.

2. A volume apparatus according to claim 1, wherein the first semiconductor voltage dividing circuit and the second semiconductor voltage dividing circuit are formed in the same configuration and at the same time the first semiconductor switch circuit and the second semiconductor switch circuit are formed in the same configuration.

3. A volume apparatus according to claim 1, wherein a buffer is provided between the output of the first semiconductor switch circuit and the one input terminal of the differential amplifier and another buffer is provided between the output of the second semiconductor switch circuit and the other input terminal of the differential amplifier.

* * * * *